United States Patent
Parsons et al.

(12) 
(10) Patent No.: US 6,455,907 B1
(45) Date of Patent: Sep. 24, 2002

(54) MAGNETORESISTIVE SENSOR ASSEMBLY AND METHOD FOR MANUFACTURING SAME

(75) Inventors: Wayne L Parsons; Simon Honwah Chan, both of El Paso, TX (US); Cesar J Hernandez, Chihuahua (MX)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/662,061

(22) Filed: Sep. 14, 2000

(51) Int. Cl.[7] .................. G01B 7/00; H01L 43/08; H01L 23/495
(52) U.S. Cl. ............... 257/421; 257/666; 257/676; 324/207.13; 324/207.21
(58) Field of Search .................. 257/421, 424, 257/427, 666, 676; 324/207.13, 207.21

(56) References Cited

U.S. PATENT DOCUMENTS 5,488,294 A * 1/1996 Liddell et al. ............. 324/202
5,912,556 A * 6/1999 Frazee et al. ............ 324/207.2
6,064,200 A * 5/2000 Saito et al. ............ 324/207.25

FOREIGN PATENT DOCUMENTS

JP    2001-095910 A  *  4/2001  ............. A61L/9/01

\* cited by examiner

Primary Examiner—Allan R. Wilson
(74) Attorney, Agent, or Firm—Margaret A. Dobrowitsky

(57) ABSTRACT

A magnetoresistive sensor assembly includes a housing and a permanent magnet disposed within the housing. The sensor also includes two magnetoresistive dies within the housing in close proximity to the magnet. Three leads that are electrically connected to the magnetoresistive dies extend from the housing. The sensor assembly is manufactured using a leadframe formed with plural long slots and plural short slots. The magnet is attached to the leadframe such that the corners of the magnet are visible through the leadframe, and the magnetoresistive dies are attached to the leadframe based on the position of the magnet. As such, greater precision concerning the placement of the magnetoresistive dies relative to the magnet can be achieved.

5 Claims, 2 Drawing Sheets

MAGNETORESISTIVE SENSOR ASSEMBLY AND METHOD FOR MANUFACTURING SAME

TECHNICAL FIELD

The present invention relates generally to magnetic field sensors.

BACKGROUND OF THE INVENTION

A typical vehicle includes numerous sensors that are used to monitor many physical parameters necessary to ensure the proper operation of the vehicle and its subsystems. For example, crank and cam sensors are used to sense the angular motion of the engine crank and cam shafts to ensure that the engine is running properly, e.g., that the ignition system is properly timed. Typically, these devices operate by distinguishing between high and low slots formed in a rotating targeting wheel opposite the sensor. For maximum sensitivity, two magnetoresistive (MR) die must be centered exactly (±13 μm) on a permanent magnet so the signals from the MR die are symmetrical and intersect precisely in the center of the slots formed in the target wheel.

It happens that the traditional method of packaging such an MR device includes placing two MR die on a very precise, and relatively expensive, leadframe and then locating the permanent magnet relative to the leadframe. In this method, the placement of the MR die and the magnet is performed blind relative to each other. More specifically, a theoretical magnet center is calculated from the leadframe dimensions and the MR die are placed on the leadframe based on this calculated center. Unfortunately, basing the placement of the MR die on this theoretical center results in a reduction in precision.

The present invention has recognized these prior art drawbacks, and has provided the below-disclosed solutions to one or more of the prior art deficiencies.

SUMMARY OF THE INVENTION

A magnetoresistive sensor assembly includes a housing. At least one permanent magnet is disposed within the housing, and at least two magnetoresistive dies are placed proximal to the magnet. Furthermore, at least three leads extend from the housing. The leads are electrically connected to the magnetoresistive dies. Additionally, the leads are part of a leadframe that forms plural slots. As intended by the present invention, the slots facilitate placement of the magnetoresistive dies based on the placement of the magnet on the leadframe.

In a preferred embodiment, the leadframe includes at least four identical sections. Each section of the leadframe forms plural long slots and plural short slots. The magnet is attached to the leadframe such that at least a portion of the magnet is visible through the frame in order to facilitate placement of the magnetoresistive dies with respect to the magnet. Preferably, the magnetoresistive dies are connected to the leads using a wire bonding process, and the leadframe and the leads are made from copper. In a preferred embodiment, the magnet, and the magnetoresistive dies are attached to the leadframe, the housing is installed around the magnet and the magnetoresistive dies, and the sensor assembly is separated from the leadframe.

In another aspect of the present invention, a method for manufacturing a sensor includes providing a leadframe that forms plural slots. At least one magnet is attached to the leadframe such that at least a portion of the magnet is visible through the leadframe. Moreover, at least two magnetoresistive dies are attached to the leadframe based on the visible portion of the magnet.

In yet another aspect of the present invention, a leadframe used in a process to manufacture a sensor assembly includes at least one section that forms plural long slots and forming plural short slots.

The present invention will now be described, by way of example, with reference to the accompanying drawings, in which:

DESCRIPTION OF AN EMBODIMENT OF THE INVENTION

Figure 1:
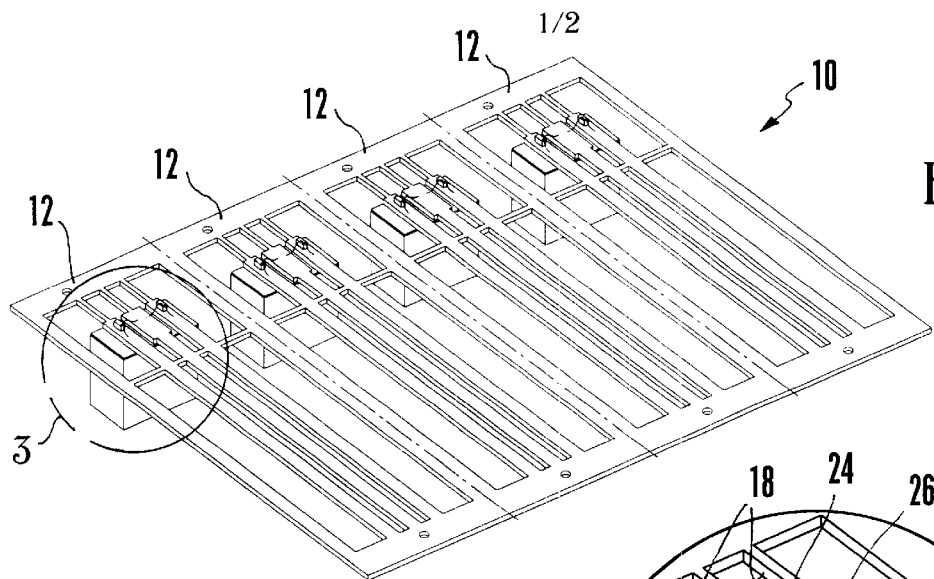
FIG. 1 is a perspective view of the leadframe with the magnets installed thereon.
Figure 2:
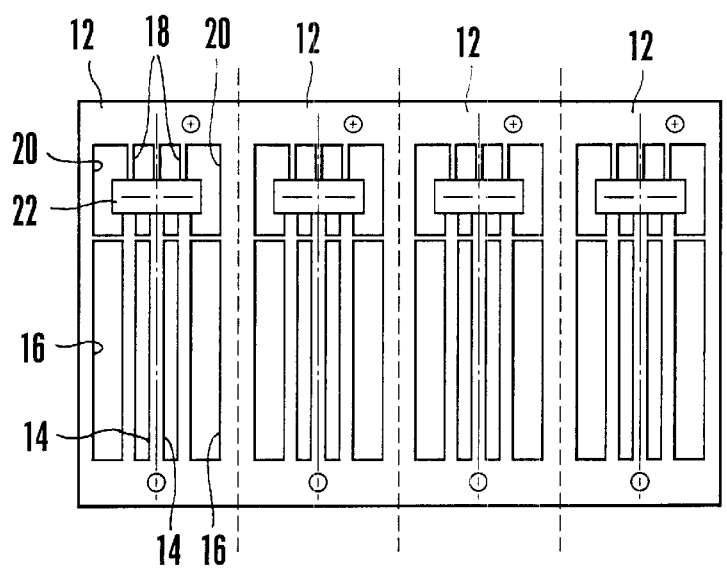
FIG. 2 is a bottom plan view of the leadframe with the magnets installed thereon.
Figure 4:
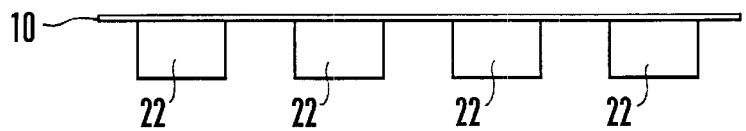
FIG. 4 is a front plan view of the leadframe with the magnets installed thereon.

Referring initially to FIGS. 1 and 2, a leadframe is shown and generally designated 10. FIGS. 1 and 2 show that the leadframe 10 is formed with four identical sections 12, as differentiated by dashed lines in FIGS. 1 and 2. As more clearly shown in FIG. 2, each section 12 is formed with two relatively long, relatively narrow, generally rectangular, slots 14 that are parallel to each other. These long, narrow slots are flanked by two relatively long, relatively wide, generally rectangular slots 16 that are parallel to each other and the long, narrow slots 14. It is to be appreciated that, in the preferred embodiment, the long, narrow slots 14 are the same length as the long, wide slots 16.

FIG. 2 shows that each section also forms two relatively short, relatively narrow, somewhat rectangular slots 18. The short ends of these short, narrow slots 18 are adjacent to, but do not abut, the short ends of the long, narrow lots 14. As shown in FIG. 2, the short, narrow slots 18 are parallel to each other and are flanked by two relatively short, relatively wide, generally rectangular slots 20. The short ends of these short, wide slots 20 are adjacent to, but do not abut, the shorts ends of the long, wide slots 16. It is to be appreciated that, in the preferred embodiment, the short, narrow slots 18 are the same length as the short, wide slots 20. Thus, the leadframe 10, forms an array of short slots 18, 20 that are adjacent to an array of long slots 14, 16.

FIGS. 1 through 4 show that each section 12 of the leadframe 10 includes a generally parallelepiped-shaped permanent magnet 22 attached to the leadframe 10 such that it is transverse to and spans the short slots 18, 20.

Figure 3:
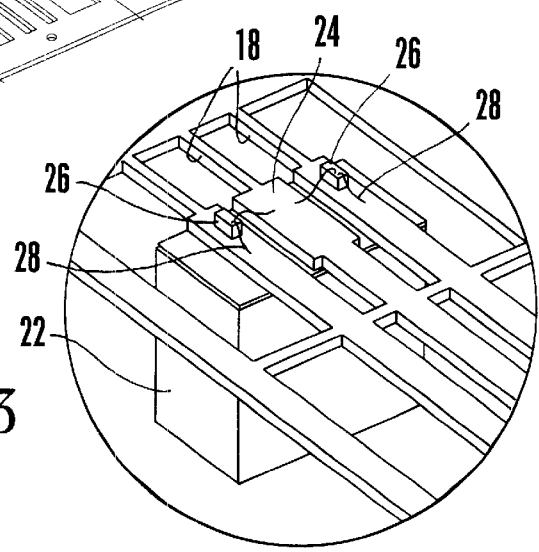
FIG. 3 is a detail view of a magnet as indicated by circle 3 in FIG. 1.

Referring to FIG. 3 for detail regarding placement of the magnet, it is shown that a relatively wide mounting plate 24 is formed by the leadframe 10 between the short, narrow slots 18. In each section 12 of the leadframe 12, the magnet 22 is attached to the mounting plate 24. Moreover, referring to FIG. 3, it is shown that the much of the upper perimeter of the magnet 22 can be seen from above the leadframe 10 through the short slots 18, 20. As intended by the present invention, the short, wide slots 20 allow the upper corners of the magnet 22 to be visible to a die bonder's pattern-recognition camera. The visible corners of the magnet 22, in turn, are used to calculate the center of the magnet and locate two MR dies 26 relative to the actual center of the magnet. Thus, blind placement of the MR dies 26 relative to a magnet 22 based on a theoretical magnet center is eliminated and precise placement of the MR dies 26 relative to a magnet 22 is greatly facilitated with minimal cost. The MR dies 26 are electrically connected to the leadframe 10 using wire bonds 28.

Since location of the MR dies 26 is performed based on the magnet 22 and not the leadframe 10 different materials for the leadframe 10 can be used. Traditionally, the leadframe 10 is made of Alloy 42 metal that is very magnetic in nature. The leadframe 10 of the present invention can be made from pure copper with selective plating for the gold wire and aluminum wire bonding, described below. Since the material for the leadframe 10 is non-magnetic, wider terminal leads are possible thereby reducing EMC effects that can impede sensor performance. Moreover, manufacturing the leadframe 10 from copper permits aluminum wire bonding of the leads on the magnetoresistive sensor assembly, described below. A wire bonding process is preferred to a less robust soldering process in high temperature, high vibration applications, e.g. automotive engines.

Figure 5:
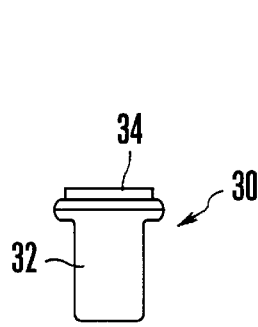
FIG. 5 is a side plan view of an MR die.
Figure 6:
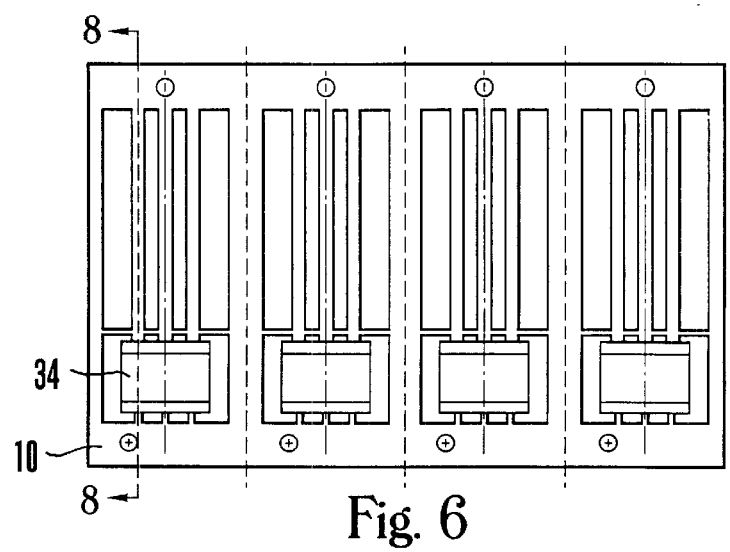
FIG. 6 is a top plan view of the leadframe with the MR dies installed over the magnets.
Figure 7:
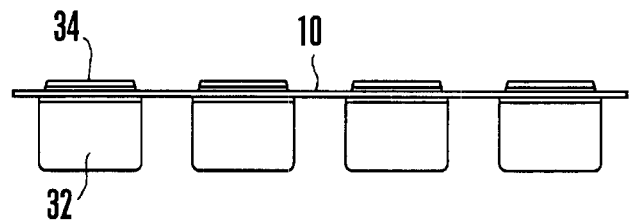
FIG. 7 is a side plan view of the leadframe with the MR dies installed over the magnets.
Figure 8:
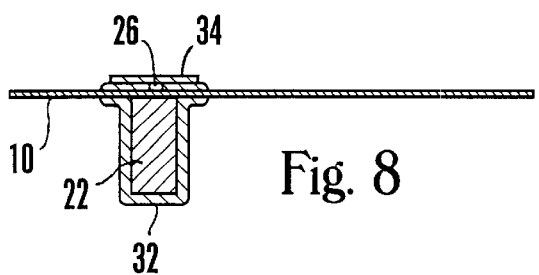
FIG. 8 is a cross-section view of the leadframe with the MR dies installed over the magnets taken along line 8—8 in FIG. 6.

Referring now to FIG. 5, a sensor housing is shown and generally designated 30. As shown in FIG. 5, the sensor housing 30 includes a base 32 and a top 34. FIGS. 6 through 8 show that the base 32 of the sensor housing 34 is fitted over the magnet 22 and the top 34 of the sensor housing 30 is attached thereto.

Figure 9:
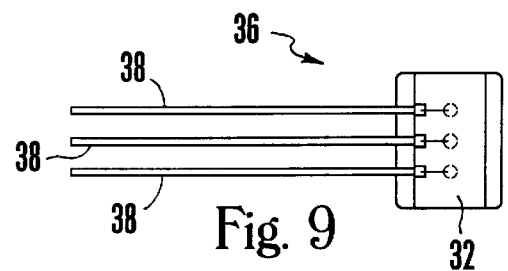
FIG. 9 is a bottom plan view of the magnetoresistive sensor assembly.
Figure 10:
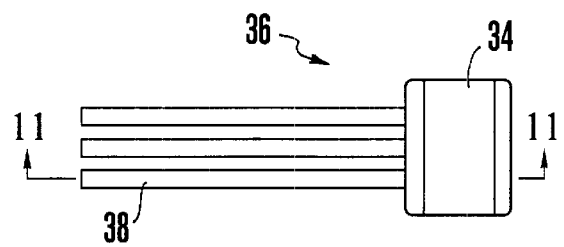
FIG. 10 is a top plan view of the magnetoresistive sensor assembly.
Figure 11:
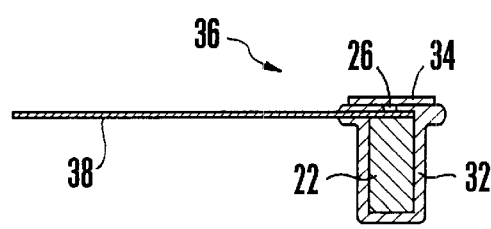
FIG. 11 is a cross-section view of the magnetoresistive sensor assembly taken along line 11—11 in FIG. 10.

FIGS. 9 through 11 show a magnetoresistive sensor assembly that is generally designated 36. Once the sensor housings 30 are installed over the magnets 22 as described above, the magnetoresistive sensor assemblies 36, one per each section 12 of the leadframe 10, are separated from the leadframe 10. FIGS. 9 through 11 show that each magnetoresistive sensor assembly 36 that is separated from the leadframe 10 includes the permanent magnet 22 described above, the two MR dies 26 described above, and three leads 38 that extend from within the sensor housing 30. It is to be appreciated that the leads 38 are electrically connected to the MR dies 26, but they are electrically isolated from each other. It is also to be appreciated that the leads 38 are the portions of the leadframe 10 that separate the long slots 14, 16 described above. Once the magnetoresistive sensors 36 are separated from the leadframe 10, they can be magnetized, heat stabilized, and tested as is well known in the art.

With the configuration of structure described above, it is to be appreciated that the magnetoresistive sensor assembly and method for manufacturing same provides a manufacturing process that facilitates placement of the MR dies on the permanent magnets while reducing the cost of the placement process. Specifically, a leadframe is provided that allows placement of the MR dies on the magnets based on the actual center of the magnets and not a theoretical center calculated based on the leadframe dimensions. Therefore, blind placement of the MR dies relative to the magnets is eliminated thus increasing the precision of the sensor manufacturing process.

While the particular MAGNETORESISTIVE SENSOR ASSEMBLY AND METHOD FOR MANUFACTURING SAME as herein shown and described in detail is fully capable of attaining the above-described objects of the invention, it is to be understood that it is the presently preferred embodiment of the present invention and thus, is representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it is to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. section 112, sixth paragraph, unless the element is expressly recited using the phrase "means for."

What is claimed is:

1. A magnetoresistive sensor assembly comprising:

a housing;

at least one permanent magnet disposed within the housing, the magnet defining at least four corners;

at least two magnetoresistive dies placed proximal to the magnet; and at least three leads extending from the housing, the leads being directly electrically connected to the magnetoresistive dies without any intervening structure therebetween, the leads being part of a leadframe forming plural slots, the four corners of the magnet being visible through the slots.

2. The sensor assembly of claim 1, wherein the leadframe includes at least four identical sections and each section forms plural long slots and plural short slots, the magnet being attached to the leadframe such that the four corners are visible through the leadframe and the magnetoresistive dies are placed on the leadframe relative to the four corners of the magnet.

3. The sensor assembly of claim 1, wherein the magnetoresistive dies are connected to the leads using a wire bonding process.

4. The sensor assembly of claim 1, wherein the leadframe and the leads are made from copper.

5. The sensor assembly of claim 1, wherein the magnet, and the magnetoresistive dies are attached to the leadframe, the housing is installed around the magnet and the magnetoresistive dies, and the sensor assembly is separated from the leadframe.

* * * * *